United States Patent
Drewery et al.

(10) Patent No.: US 7,405,163 B1
(45) Date of Patent: Jul. 29, 2008

(54) SELECTIVELY ACCELERATED PLATING OF METAL FEATURES

(75) Inventors: John Stephen Drewery, Alameda, CA (US); Steven T. Mayer, Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 870 days.

(21) Appl. No.: 10/824,069

(22) Filed: Apr. 13, 2004

Related U.S. Application Data

(63) Continuation-in-part of application No. 10/739,822, filed on Dec. 17, 2003.

(51) Int. Cl.
*H01L 21/303* (2006.01)

(52) U.S. Cl. .................... 438/745; 438/750; 205/123

(58) Field of Classification Search ............... 438/692, 438/693, 74, 750, 754, 745; 205/123, 126
See application file for complete search history.

(56) References Cited

U.S. PATENT DOCUMENTS

| | | | | |
|---|---|---|---|---|
| 5,158,860 | A | * | 10/1992 | Gulla et al. ................ 430/315 |
| 6,534,116 | B2 | | 3/2003 | Basol |
| 6,863,795 | B2 | | 3/2005 | Teerlinck |
| 6,867,136 | B2 | | 3/2005 | Basol |
| 2001/0013472 | A1 | * | 8/2001 | Nakamura et al. .......... 205/103 |
| 2004/0226827 | A1 | * | 11/2004 | Matsuda et al. ............. 205/123 |

OTHER PUBLICATIONS

Osterwald et al., "Wirkung von Badzusätzen bei der kathodischen Metallabscheidung", Galvanotechnik, 66, Nr. 5, pp. 360-365 (1975). Leuze Verlag, Saulgau, Germany.

* cited by examiner

*Primary Examiner*—Lan Vinh
(74) *Attorney, Agent, or Firm*—Thomas Swenson

(57) ABSTRACT

An accelerator solution is globally applied to a workpiece to form an accelerator film, and then a portion of the accelerator film is selectively removed from the workpiece to form an acceleration region having a higher concentration of accelerator. The higher concentration of accelerator causes metal to deposit at a faster rate in the acceleration region than in a non-accelerated region for the duration of metal deposition. To make a metal feature, a resist layer is applied to a workpiece surface and patterned to form a recessed region and a field region. Then, a metal seed layer is deposited on the workpiece surface. An accelerator solution is applied so that an accelerator film forms on the metal seed layer. A portion of the accelerator film is selectively removed from the field region, leaving another portion of the accelerator film in the recessed region. Then, copper is electroplated onto the workpiece, and the copper plates at an accelerated rate in the recessed region, resulting in a greater thickness of copper in the recessed region compared to copper in the field region. A wet etch is performed to remove copper from the field region. Then, the resist is removed from the field region, resulting in a coarse copper wire.

46 Claims, 7 Drawing Sheets

SELECTIVELY ACCELERATED PLATING OF METAL FEATURES

RELATED APPLICATIONS

This application is a continuation-in-part application under 37 CFR 1.53(b) of co-owned and co-pending U.S. patent application Ser. No. 10/739,822, filed Dec. 17, 2003, by Mayer et al., having the title "Method for Planar Electroplating", which is hereby incorporated by reference as if fully contained herein.

FIELD OF THE INVENTION

The invention relates in general to the structure and fabrication of metal features in electronic equipment, and more particularly to forming copper wires in printed wiring boards and semiconductor packaging.

BACKGROUND OF THE INVENTION

Relatively large copper lines in electronic equipment, for example, in a printed wiring board ("PWB"), are typically formed by a process including lamination, photolithography (in which areas of copper to be removed are exposed), and wet etching. A wet etch is generally isotropic. Therefore, such processes are usually limited to the formation of relatively wide copper lines so that undercutting of copper does not occur. Copper lines in printed wiring boards generally have dimensions not less than about 0.5 mm wide and about 20 microns (μm) thick. Typically, more than 30 percent of copper deposited during formation of copper lines in stripped. The resulting copper-contaminated etch solution is a waste product requiring expensive disposal. Significantly larger quantities of copper are consumed in the PWB industry compared to the integrated circuit chip industry. PWB production is acutely price sensitive.

Another method of patterning copper lines, that was also commonly used for making small lines until the invention of the damascene process, is through-resist plating. In this technique, a metal seed layer is first deposited to cover completely a base plane substrate, resist is applied over the seed layer, and areas to be plated-up are optically exposed and developed (wherein the resist is removed to expose copper seed at the base). Then, during electroplating, metal is deposited only in the exposed and developed areas. In such a technique, copper can be plated controllably only to the thickness of the resist. If additional copper is plated, it is no longer confined by the walls of the lines defined by the resist, and will tend to encroach sideways. Also, in this technique, the plating solution contacts the resist. As a result of leaching of organic electroactive contamination from the resist, the lifetime of the plating solution is often reduced, adding cost to the overall process. A damascene process is well suited for producing lines of small depth (or height or thickness) in features having high aspect ratio. A damascene process would be prohibitively expensive for thick copper layers due to the high cost of removing copper from the insulating dielectric surface ("field"). In a damascene process, copper plates onto the field area to a thickness corresponding to the desired height (or thickness) of the wiring line, and all of this excess copper must be removed in order to form the copper line.

Thus, none of these techniques is ideally suited to the production of large copper lines, and each incurs considerable costs associated with consumed material and waste disposal. Therefore, it would be desirable to have a technique for plating copper that would create relatively thick wires without the need to remove a large amount of copper, and that would avoid electrolyte contamination associated with through-resist plating, allowing for longer plating bath lifetimes. Preferably, a technique for forming large copper lines would be able to plate square-sided wires, which would not have to be defined through etching of trenches in a dielectric.

SUMMARY OF THE INVENTION

Embodiments in accordance with the invention provide a method of forming metal wires, particularly copper-containing wires, by an additive process, without using a dielectric etch or chemical mechanical polishing (CMP), and employing minimal isotropic wet etch of the metal. A method in accordance with the invention is useful for replacing through-resist plating, which is presently used for package-level wiring. It is also useful in place of subtractive etch techniques presently used for forming printed wiring boards. In certain embodiments, a thick wire is plated using a thin resist pattern, and dry-etch processing is not necessary. Consumption of etchants used in conventional subtractive processing and plate-through-resist processing is thereby reduced or eliminated. Preferred embodiments reduce or eliminate exposure of plating bath to resist, thereby extending the useful life of the plating bath.

A method in accordance with the invention utilizes a plating accelerator in a novel fashion that was generally disclosed in co-owned and co-pending U.S. patent application Ser. No. 10/739,822, which is incorporated by reference. A generalized method of using a plating accelerator comprises processes of: globally applying an accelerator to a workpiece to form a global accelerator film on the workpiece; then selectively removing a portion of the accelerator film from the workpiece to form an acceleration region and a non-activated region on the workpiece, the acceleration region comprising accelerator at a higher concentration than in the non-activated region; and using a plating technique to deposit metal on the workpiece, wherein the accelerator at higher concentration in the acceleration region causes a faster rate of metal plating in the acceleration region relative to a rate of metal plating in the non-activated region. After applying the accelerator, some embodiments include removing accelerator from the workpiece, without substantially removing the accelerator film from the workpiece. In some embodiments, the accelerator is applied to a metallic layer on the workpiece; for example, to a metal seed layer or to a metal-containing diffusion/barrier layer. Typically, metal plating is continued to a desired thickness of metal in the acceleration region, and the accelerator in the acceleration region continues to cause a faster rate of metal plating in the acceleration region relative to a rate of metal plating in the non-activated region. In certain embodiments, applying the accelerator comprises applying accelerator molecules. In some embodiments, applying accelerator molecules comprises applying a liquid accelerator solution comprising accelerator molecules. Exemplary accelerator molecules include 2-mercaptoethane sulfonic acid (MESA), 3-mercapto-1-propane sulfonic acid (MPSA), mercaptopyruvate, 3-mercapto-2-butanol, 1-thioglycerol, dimercaptopropane sulfonic acid (DMPSA), dimercaptoethane sulfonic acid (DMESA), and salts thereof.

A basic embodiment of a method in accordance with the invention for forming a copper wiring line includes processes of: applying a resist layer to a base layer of a workpiece; patterning the resist layer to form a recessed region and an adjacent field region in the resist layer; then depositing a substantially uniform metal seed layer on the workpiece, including in the recessed region and on the field region; then causing a plating accelerator to become attached to the metal seed layer selectively in the recessed region, with relatively little or no accelerator attached to the metal seed layer in the field region, thereby forming an acceleration region in the recessed region; and then plating copper on the workpiece, whereby the accelerator selectively attached in the acceleration region increases a rate of copper plating in the acceleration region relative to a rate of copper plating in the field region. In some embodiments in accordance with the invention, electroplating copper is continued until the thickness of plated copper in the acceleration region is at least 3 μm thicker than a field thickness of copper in the field region in order to make copper wiring having a thickness of 3 μm or greater. Embodiments typically also include processes of removing copper from the field region after plating the copper, resulting in a wiring line having a wire width at least two times greater than the wire thickness. Preferred embodiments include a wet etch to remove copper from the field region. Embodiments in accordance with the invention also typically include removing the resist layer from the field region after removing the copper from the field region.

Causing an accelerator to become attached to the metal seed layer selectively in the recessed region typically includes globally applying an accelerator film on the metal seed layer, and then selectively removing at least a portion of the accelerator film from the metal seed layer in the field region. Application of an accelerator film is generally conducted using an accelerator solution, and plating copper is generally conducted using a plating solution, wherein the accelerator solution comprises a greater concentration of the accelerator than the plating solution. Typically, the plating solution comprises an accelerator concentration of substantially zero. Generally, contacting the metal seed layer with an accelerator solution containing these chemically active accelerators creates an accelerated, or activated, surface. In other cases, as described in co-owned and co-pending U.S. patent application Ser. No. 10/739,822, some accelerators (e.g. DMPSA, DMESA) exhibit electrochemical activity and can be transformed into other more-accelerating materials after the application of an appropriate current in an electroplating solution containing the additive.

Selectively removing the accelerator film from the field region of a workpiece typically involves contacting the workpiece surface with a pad that selectively removes the accelerator film from the field region. Typically, the workpiece surface is contacted with the pad for a given period of time and then this contact is stopped prior to plating the copper. Generally, it is not required to contact the workpiece surface with the pad during the entire plating process. In certain embodiments, the pad is contacted with the surface and the accelerator is removed from the field region at least once during processes of electroplating copper (also including all of the time during plating processes). In cases where the field region is non-uniform (not completely flat/planar), this allows the originally recessed regions of the field to grow preferentially, reaching the plane of the surface that was originally the highest, and allowing the pad to then remove the accelerator from the newly exposed region.

Certain embodiments include applying accelerator to the workpiece surface during processes of electroplating copper (electrochemically active acceleration). In certain embodiments, electroplating copper is conducted in a controlled potential mode. In certain embodiments, electroplating copper includes applying a substantially constant current without pulsing the current.

A basic embodiment of a generalized method in accordance with the invention for forming a metal structure in an electronic device includes processes of: providing a workpiece having a surface with a recessed region and an adjacent field region; then causing an accelerator to become attached to the workpiece surface selectively in the recessed region, thereby forming an acceleration region in the recessed region, with relatively little or no accelerator attached to the workpiece surface in the field region; then depositing metal on the workpiece, whereby the accelerator attached in the acceleration region increases a rate of metal deposition in the acceleration region relative to a rate of metal deposition in the field region. In some embodiments, metal deposition is continued until an accelerated thickness of deposited metal in the acceleration region is at least 3 μm thicker than a field thickness of metal in the field region. Typically, embodiments in accordance with the invention also include removing metal from the field region after depositing the metal, usually forming a metal structure having a structure width at least two times greater than a structure thickness. Removing metal from the field region preferably includes conducting a wet etch to remove metal from the field region.

Causing an accelerator to become attached to the workpiece surface selectively in the recessed region typically includes applying an accelerator film on the workpiece surface and then selectively removing at least a portion of the accelerator film from the workpiece surface in the field region. In general, the workpiece comprises a base layer, and a method includes applying a resist layer to the base layer, and then patterning the resist layer to form the recessed region and the field region.

Preferred embodiments include applying a resist layer to the base layer of the workpiece, then patterning the resist layer to form the recessed region and the field region, removing metal from the field region after the processes of plating metal, and then removing the resist layer from the field region after the processes of removing metal from the field region. Certain embodiments include depositing a metal seed layer on the workpiece, including in the recessed region and in the field region, before the processes of causing an accelerator to become attached. Some embodiments include depositing an adhesion/barrier layer, either on the base layer before applying the resist layer, or on the workpiece after patterning the resist layer and before depositing a metal seed layer.

DETAILED DESCRIPTION OF THE INVENTION

Figure 1:
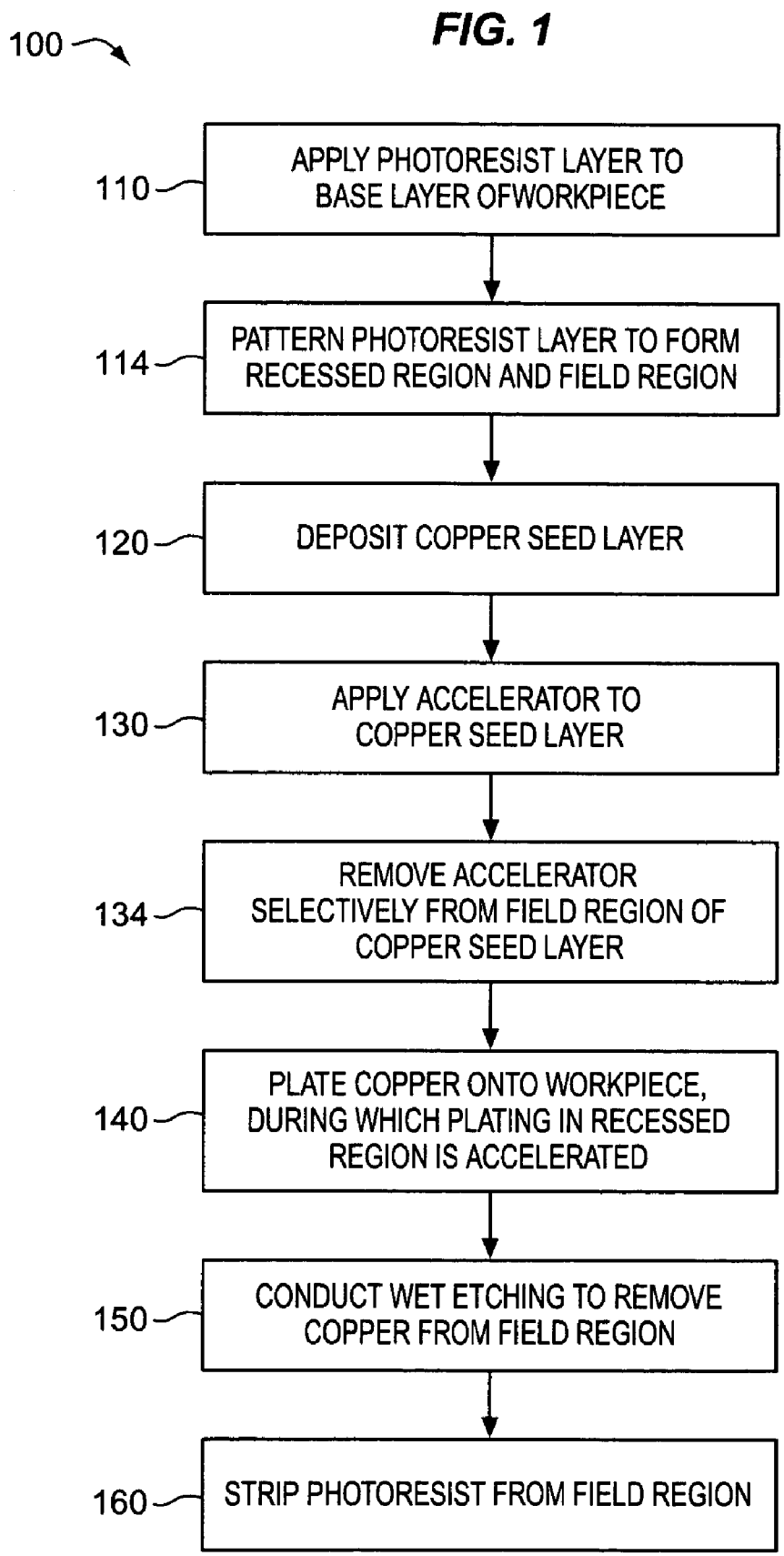
FIG. 1 depicts a process flow diagram of fabrication processes of an exemplary method in accordance with the invention for making a copper wiring line on a printed wiring board ("PWB")

Embodiments in accordance with the invention are described herein with reference to FIGS. 1-16. It should be understood that FIGS. 2-13, depicting an electronic device in sequential stages of fabrication in accordance with the invention, are not meant to be actual cross-sectional views of an actual electronic device. In actual devices, the layers will not be as regular and the thicknesses may have different proportions. The various layers in actual devices often are curved and possess overlapping edges. The figures instead show idealized representations which are employed to explain more clearly and fully embodiments of the invention than would otherwise be possible. Also, the figures represent only one of innumerable variations of electronic devices that can be fabricated in accordance with the invention.

In the embodiments described below, a "damascene" technique is used to create a relatively large metal feature, such as a metal wire. The present technique in accordance with the invention is, however, not to be confused with the generally used damascene method for forming copper wires because the present technique does not usually include dry-etch or metal-CMP processes.

In certain embodiments in accordance with the invention, an accelerator is applied to the surface of a metal seed layer and then selectively removed from a portion of the surface. When the resulting surface is plated in a suppressing electrolyte, copper grows as much as 20 times faster in regions still containing accelerator than in regions from which the accelerator was removed. Thus, after selective application of an accelerator to the surface of a workpiece, metal plating generates a thicker metal structure, or feature, in the acceleration regions than in un-accelerated regions. Techniques for selective plating of metal onto a surface have been described in co-pending and co-owned U.S. patent application Ser. No. 10/739,822, filed Dec. 17, 2003, by Mayer et al., having the title "Method for Planar Electroplating", which is incorporated by reference.

The word "substrate" herein can mean an entire workpiece, an underlying insulative material on which wiring is formed, as well as any object on which some material is deposited. In this disclosure, the terms "substrate", "workpiece surface" and related terms generally mean the surface of the workpiece as it exists at a particular phase of fabrication and on which a particular fabrication process is being conducted.

The long dimensions of workpiece 202 and insulative material 204 in FIGS. 2-13 define planes that are considered to be a "horizontal" plane herein, and directions perpendicular to this plane are considered to be "vertical". Terms of orientation herein, such as "above", "top", "upper", "below", "bottom" and "lower", mean relative to insulating material 204. That is, if a second element is "above" a first element, it means it is farther from insulative material 204; and if it is "below" another element, then it is closer to insulative material 204 than the other element. Similarly, dimensional terms, such as "high" and "higher", have very usual meanings with reference to the horizontal plane defined by the long dimensions of workpiece 202 and insulating material 204 in FIGS. 2-13. Terms such as "thickness", "depth" and "height" refer to a dimension in a vertical direction, and the terms "wide" and "width" refer to a dimension in the horizontal direction. Terms such as "above" and "below" do not, by themselves, signify direct contact. However, terms such as "on" or "onto" usually signify direct contact of at least a portion of one layer with at least a portion of an underlying or adjacent layer. As depicted in FIGS. 2-13, a single metal wire 250 (FIG. 11) is formed on insulating layer 204 of workpiece substrate 202. It is understood that embodiments in accordance with the invention are suitable for fabricating a plurality of wires or other relatively coarse metal features in single or multilayer electronic devices.

The term "plating" refers generally to wet methods of depositing metal, including electrochemical and electroless techniques known in the art. Methods in accordance with the invention are also practiced by depositing metal using dry techniques; for example, using PVD techniques known in the art.

The terms "accelerator", "accelerator species" and related terms are used interchangeably in this specification to designate chemical species that activate the surface of a workpiece and enable a greater rate of metal deposition than in areas with less or no accelerator. The term "species" is used broadly to include an atom, a molecule, a molecular fragment or group, and their combinations and complexes. The terms "accelerator", "accelerator film" and related terms are also used broadly to designate both accelerator species and also a formulation that includes accelerator molecules but which can also include other materials, such as liquid or dried solvent, precursor compounds of accelerator species, and formulation materials. While the term "accelerator solution" is used broadly here to mean any liquid suitable for use as an accelerator, an accelerator solution in accordance with the invention typically comprises a known amount of accelerator molecules dissolved in a liquid solvent. The meaning of the various terms as used is clear from their context. While not being bound to a particular theory or mechanism, it is believed that accelerator molecules referred to in the specification provide accelerator species that are adsorbed on a workpiece surface, which accelerator species activate the surface. Exemplary accelerators in accordance with the invention are described in co-owned and co-pending U.S. patent application Ser. No. 10/739,822, which is incorporated by reference.

The accelerating effect of certain accelerator species in accordance with the invention is also long lived. The accelerating effect persists even when surfaces on which the accelerator was initially deposited have been embedded deep inside a growing plated film. The accelerator appears to "float" on the metal surface and not be substantially incorporated into the film while the film is growing (at least not to an extent of significantly diminishing the acceleration effect). Without being bound to a particular theory, it is assumed for purposes of explanation that the accelerator remains on the surface throughout the deposition process unless removed (e.g., removed by a rubbing process).

On the one hand, the terms "acceleration region", "activated surface" and related terms and, on the other hand, the terms "non-accelerated region", "suppressed region" and similar terms are relative terms. The terms acceleration region and related terms refer to a region or area comprising a higher concentration of attached accelerator species relative to a non-accelerated (or suppressed region), and the higher concentration of accelerator species in an acceleration region is able to cause a faster rate of metal deposition than in a non-accelerated region.

The term "metal line", "wiring line" and related terms are used generally interchangeably in this specification, including the claims, to refer to relatively coarse wiring or other relatively coarse metal structure or feature (e.g., a contact pad) in an electronic device. Relatively coarse wiring is used, for example, in printed wiring boards and for package-level wiring in various electronic devices. A course wiring line or other relatively large metal feature described in this specification typically has a thickness in a range of about from 3 µm to 100 µm. Methods in accordance with the invention generally are suitable for forming metal lines or features having an aspect ratio (i.e., thickness/width) of about 0.5 or less, preferably about ⅓ or less.

The terms "region" and "area" as used herein generally have their usual meaning; that is, "area" generally designates a two-dimensional surface, whereas a "region" is generally three-dimensional. For example, the term "recessed region" refers to an etched-out space in a resist layer, while the term "field region" generally refers to a raised or exposed feature of the workpiece. Terms referring to a region are sometimes used in the specification and claims to designate a particular location on the workpiece and differentiate the location from a another workpiece location. Thus, terms such as "recessed region", "acceleration region", and "field region" are also used to designate particular footprint areas of a workpiece surface.

The terms "then", "after", "thereafter" and similar terms are used interchangeably in specification to indicate that a particular process or set of processes is conducted sometime after a previous process. These terms do not necessarily signify immediately thereafter.

The terms "resist", "resist layer", "photoresist" and related terms are used broadly to mean a layer that can be formed and patterned on a workpiece during manufacturing processes, and then removed by techniques that do not etch or remove significant amounts of other materials (e.g., copper or other metals) from the workpiece. Because a resist layer used in accordance with the invention typically is completely removed from a substrate, the degree of electrical conductivity of the resist layer is usually not important; that is, the resist layer typically may be conductive, nonconductive or semiconductive.

"Global" and related terms mean that a process is performed on a substantial portion of a workpiece surface, typically the entire surface; for example, including both field (exposed) and recessed regions of a surface.

The diagram of FIG. 1 is a process flow diagram of fabrication processes of a method 100 in accordance with the invention for making a copper wiring line on a printed wiring board ("PWB") in accordance with the invention. Although method 100 of FIG. 1 is discussed herein with reference to FIGS. 2-13 representing a PWB workpiece, it is clear that a generalized method of FIG. 1 and numerous embodiments of methods in accordance with the invention are useful generally for fabricating a metal line or other metal structure (e.g., a metal contact pad) that comprises one or more metals in addition to or instead of copper and that has a relatively small aspect ratio; for example, depth/width≦0.2.

Figure 2:
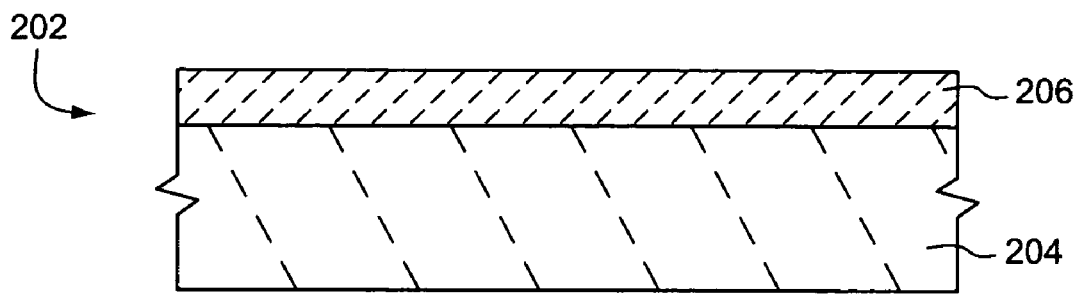
FIG. 2 depicts schematically a workpiece having an insulating dielectric base layer covered by a photoresist layer.
Figure 3:
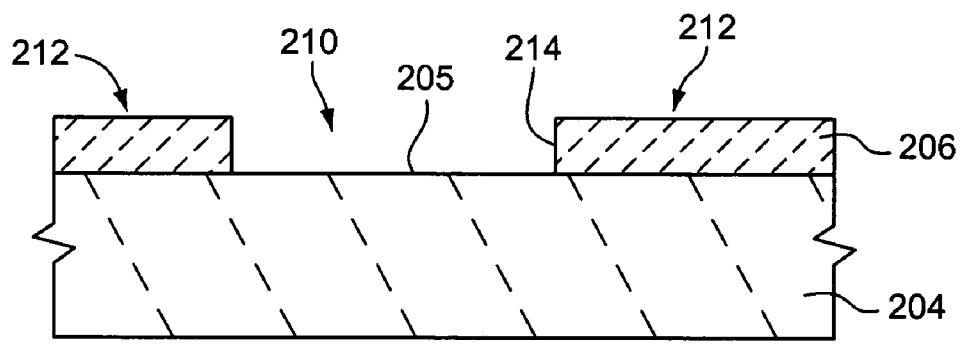
FIG. 3 depicts schematically the workpiece of FIG. 2 after the photoresist layer has been patterned and developed to form a recessed region and a field region.

FIG. 2 depicts schematically a workpiece 202 having an insulating dielectric base layer 204 with an upper surface 205. Processes 110 of method 100 include applying a photoresist layer 206 using conventional techniques to insulating base layer 204. Photoresist layer 206 typically has a thickness in a range of about from 0.2 µm to 10 µm. In processes 114, photoresist layer 206 is patterned and developed using conventional photolithographic techniques to form recessed region 210 and field region 212, as depicted in FIG. 3. A resist layer in accordance with the invention can also be patterned using conventional techniques other than photolithography. Typically, recessed region 210 is formed by removing a portion of resist layer 206 down to the upper surface 205 of insulating layer 204. Recessed region has sidewalls 214 defined by resist layer 206.

Figure 4:
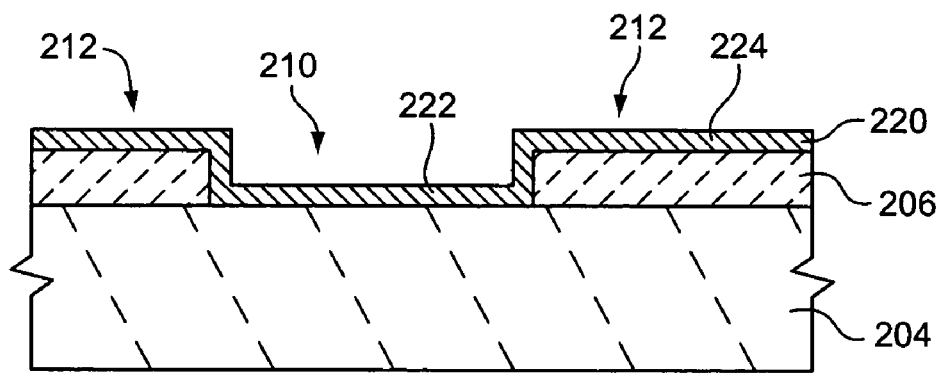
FIG. 4 depicts schematically the workpiece of FIG. 3 after a metal seed layer is deposited on the recessed region and on the exposed surface of the resist layer in the field region.

Processes 120 include depositing a metal seed layer 220 using techniques known in the art. Suitable materials for depositing on the workpiece to form metal seed layer 220 include Cu, Ru, Ni, Co, Fe, Pd, among others. Metal seed layer material deposits in recessed region 210 and in field region 212. Thus, a metal seed layer portion 222 is deposited on bottom 205 and on sidewalls 214 of recessed region 210, and a metal seed layer portion 224 is deposited on the exposed surface of resist layer 206 in field region 212, as depicted in FIG. 4. Processes 120 often also include depositing on the workpiece a metal-containing adhesion layer or barrier layer (not shown), e.g., a layer of Ta, Ti, TiW, or TiN having a thickness in a range of about 5 nm to 50 nm, before depositing seed layer 220. As a result, a metal-containing adhesion/barrier layer material is formed on bottom 205 and on sidewalls 214 of recessed region 210, and on the exposed surface of resist layer 206 in field region 212 before formation of seed layer 220. Techniques for depositing a metal-containing adhesion/barrier layer are well known in the art.

Metal seed layer 220 generally is applied by plasma vapor deposition ("PVD") or by electroless plating. A PVD seed layer may be deposited in any of a number of commercially available systems. For semiconductor wafers and similar substrates, the Novellus model "Inova™" tool is suitable. Atomic layer deposition techniques (ALD) are also potentially useful. Electroless copper or other metal seeds may be deposited using any of a variety of solutions that are well-known in the art, usually after activation of the workpiece surface by a catalyst such as metallic palladium.

Figure 5:
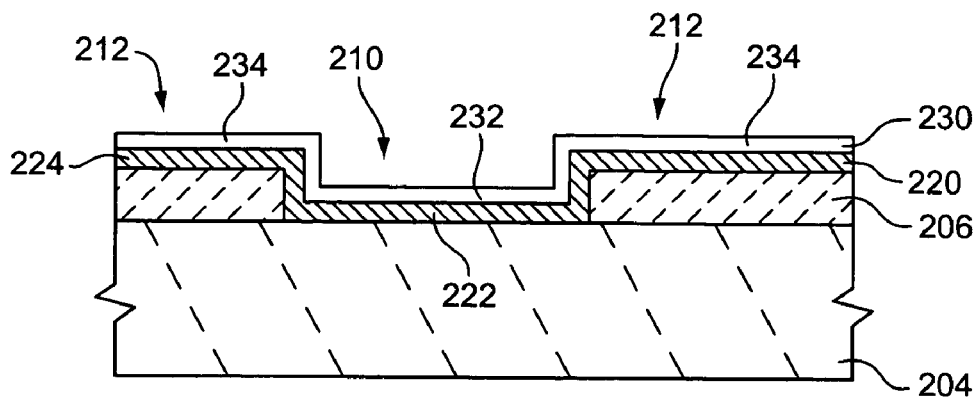
FIG. 5 depicts schematically the workpiece of FIG. 4 after a liquid accelerator solution is applied globally to the metal seed layer to form an accelerator film.
Figure 6:
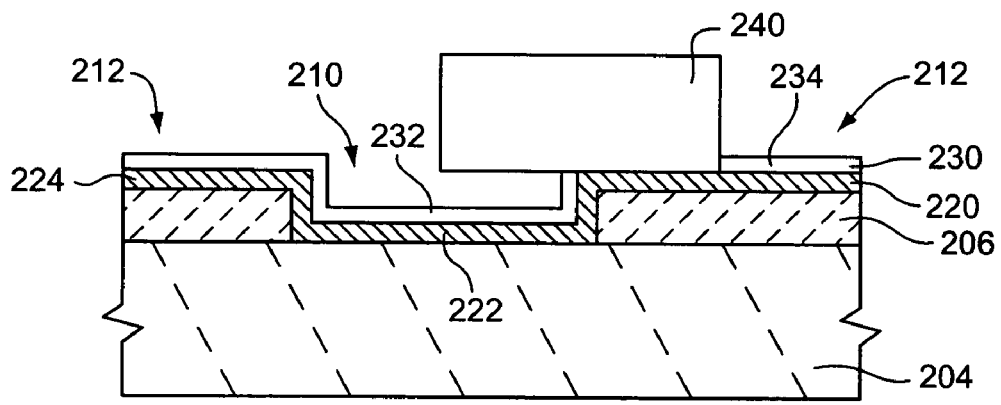
FIG. 6 depicts schematically the workpiece of FIG. 5 as a portion of the accelerator film is selectively removed from the field region.
Figure 7:
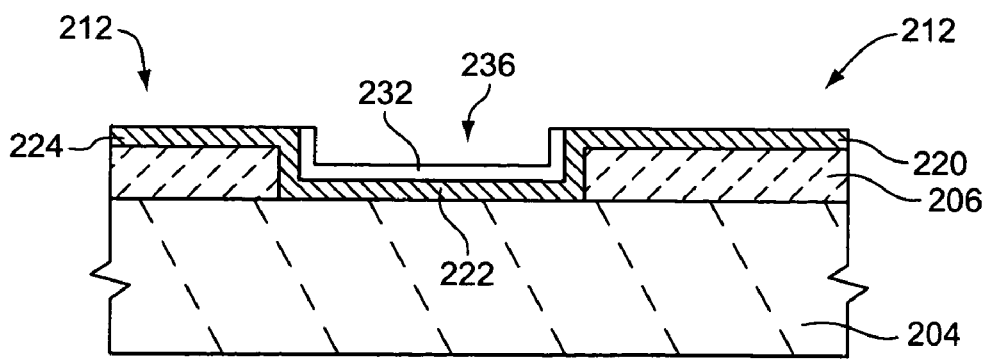
FIG. 7 depicts schematically the workpiece of FIG. 6 after a portion of the accelerator film is selectively removed from the field region, thereby forming an acceleration region in the recessed region.
Figure 8:
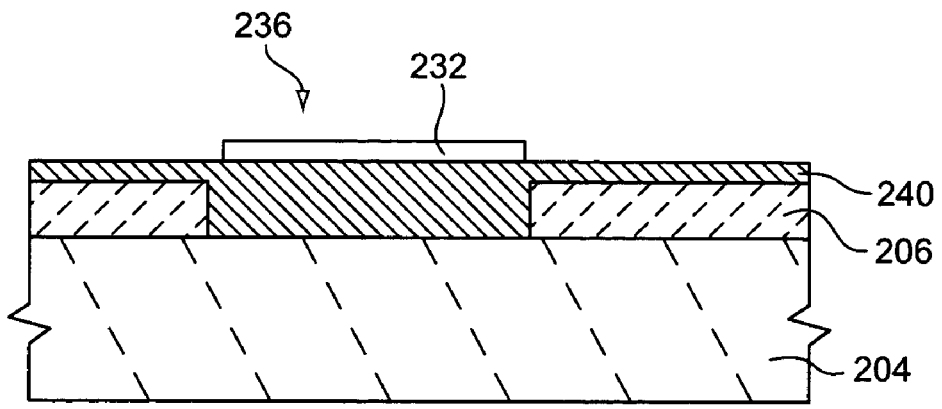
FIG. 8 depicts schematically the enhanced plating of copper in the acceleration region during an intermediate phase of plating, in which copper in the acceleration region is shown to be flush with the surrounding copper plated in the field region.
Figure 9:
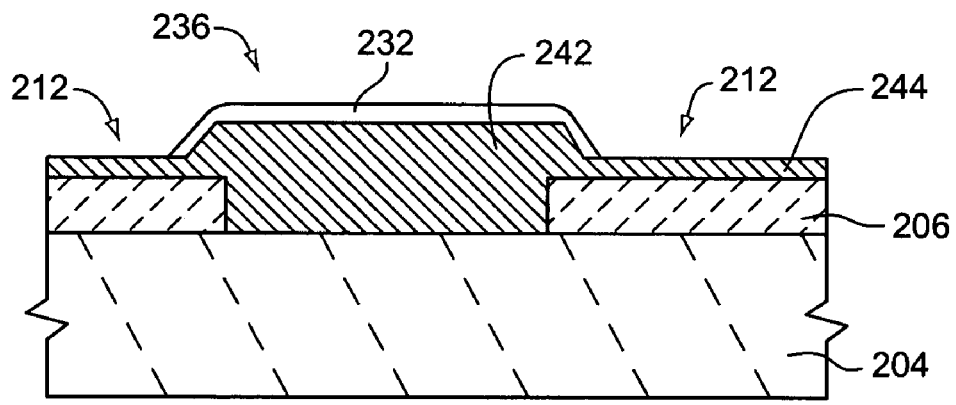
FIG. 9 depicts schematically the workpiece of FIG. 8 after continued electroplating processes in which the copper plated into acceleration region continues to grow vertically with slight sideways spreading because accelerator enhances electroplating relative to plating in the field region.

In method 100, plating accelerator is caused to become attached to the metal seed layer 220 selectively on seed layer portion 222 in recessed region 210, with relatively little or no accelerator ultimately attached to metal seed layer portion 224 in field region 212. Generally, accelerator molecules are applied globally on the workpiece substrate, in particular, on metal seed layer 220, and then the accelerator is selectively removed from field region 212 of the workpiece 202, resulting in a higher concentration of accelerator in recessed region 210. In processes 130 of method 100, a liquid accelerator solution is applied globally to metal seed layer 220 to form an accelerator film 230, as depicted in FIG. 5. Although accelerator film 230 is depicted for clarity in FIG. 5 as an extended layer, it is believed that only about a monolayer of accelerator molecules is actually adsorbed to the workpiece surface (i.e., seed layer 220). In FIG. 5, accelerator film 230 comprises an accelerator film portion 232 on seed layer portion 222 in recessed region 210, and accelerator film portion 234 on seed layer portion 224 in field region 212. Then, in processes 134, accelerator film 230 is selectively removed from field region 212; that is, accelerator film portion 234 is substantially removed, while accelerator film portion 232 in recessed region 210 is not substantially removed, as depicted in FIG. 6. After processes 134, the resulting selectively high concentration of accelerator 232 in recessed region 210 forms an acceleration region 236, as depicted in FIG. 7. Typically, accelerator portion 234 is selectively removed from the workpiece surface, that is, from metal seed layer 220, using a suitable pad 240, as depicted in FIG. 6. Pad 240 should have mechanical properties that allow it to conform to slight large-scale bowing of the substrate (length scale >1 cm) while, on the scale of the metal features to be deposited (generally <0.05 cm), rubbing only raised seed layer portion 224 and not rubbing seed layer portion 222 in recessed region 210 (i.e., in acceleration region 236). Many CMP pads have been developed for similar purposes. A conventional tool is adaptable for particular applications of the invention; for example, when a PWB is being fabricated, a roller coated with pad material is passed over the wiring board. Processes 140 comprise plating of copper onto the workpiece, particularly onto portion 222 of metal seed layer 220 in recessed region 210 (i.e., in acceleration region 236), which contains accelerator film portion 232. Typically, copper also plates onto seed layer portion 224 in field region 212, which contains little or no accelerator because accelerator film portion 234 was removed in processes 134. In accordance with the invention, copper plates at an increased, or accelerated, rate in acceleration region 236 compared to plating in field region 212. The enhanced plating of copper in acceleration region 236 is depicted in FIG. 8, in which copper plated in acceleration region 236 during an intermediate phase of plating is shown to be flush with the surrounding copper plated in field region 212. As depicted in FIG. 8, metal seed layer 220 of prior figures is not depicted because it is subsumed into the plated copper (or other plated metal). In FIG. 8, accelerator film portion 232 is depicted as having "floated" on the surface of the plated copper as it grows. A typical electroplating solution includes copper sulfate at a concentration of about 20 grams/liter, 2 molar sulfuric acid, and about 0.6 volume percent suppressor. Examples of suppressors include: S2001 from Shipley Company, block copolymer L92 from Pluronics, Inc., or one of a large number of long chain polymers of polyethylene oxide, polypropylene oxide or block or random copolymers of the related monomers. A low concentration (10 to 100 ppm) of chloride ion is often included in plating solution, which aids in the suppressor's functionality. Copper and other metals can also be plated using electroless techniques known in the art. It is understood that a method in accordance with the invention is suitable for making wiring lines comprising one or more metals in addition to or instead of copper metal, and the deposition can be performed using electroless plating (using a reducing agent) rather than electroplating (using a power supply) to reduce the metal and form the film As depicted in FIG. 9, as electroplating processes 140 continue, the copper plated into acceleration region 236 continues to grow vertically with little sideways spreading because accelerator 232 enhances electroplating relative to plating in field region 212. As a result, accelerated copper portion 242 located at acceleration region 236 is significantly thicker than field copper portion 244 in field region 212. Plating of copper is continued until a desired difference in thickness is achieved between copper in acceleration region 236 and copper in field region 212. Plating need not be continuous or uninterrupted; that is, plating may be interrupted or varied one or several times before a desired difference in thickness is achieved between copper in acceleration region 236 and copper in field region 212. For example, it may be desirable under certain circumstances to remove accelerator between plating procedures, or to vary plating solutions.

Figure 10:
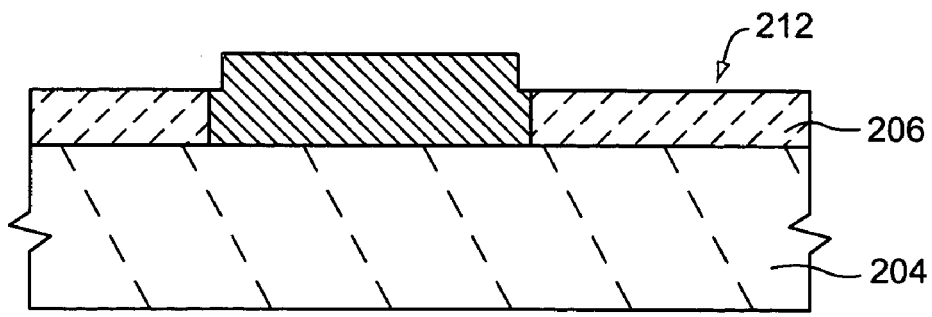
FIG. 10 depicts schematically the workpiece of FIG. 9 after wet etching of the copper from the field region.

Processes 150 include wet etching of copper portion 244 from field region 212, as depicted in FIG. 10. Wet etching is typically conducted using a ferric chloride solution well-known in the PWB industry and reported extensively in the literature. Another useful etching solution contains 0.5 to 10 g/L glycine and 3 to 40% hydrogen peroxide. Other oxidizers (e.g., persulfates, permanganate) may also be used. This type of solution has the particularly advantageous characteristics of being surface reaction controlled, thus avoiding an undesirable line-etch-rate acceleration once the field has cleared. Other techniques of selectively removing copper (or other metal, if present) can also be used.

Figure 11:
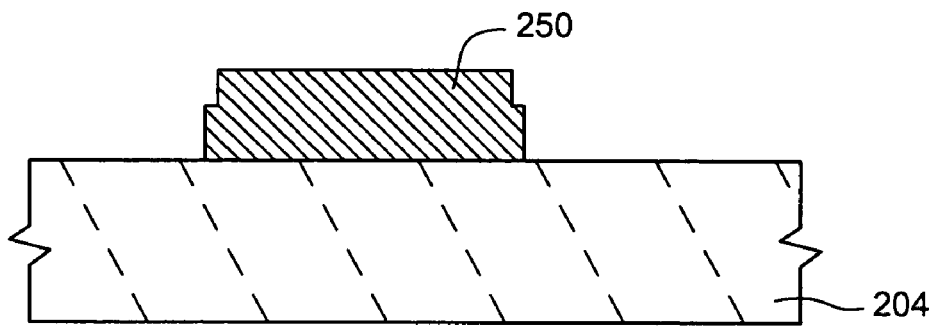
FIG. 11 depicts schematically a completed copper metal wiring line after stripping the photoresist of FIG. 10 from the field region.

Processes 160 comprise removing, or stripping, photoresist 206 from field region 212. Techniques for stripping resist are well-known in the art. The result of processes 110-160 of method 100 is formation of copper metal wiring line 250 located on insulating layer 204 of workpiece 202, as depicted in FIG. 11.

In preferred embodiments, copper is removed from field region 212 in processes 150 using an isotropic wet etching technique without first depositing a mask covering the metal in acceleration region 236. Therefore, the thickness of copper removed by etching from copper portion 242 in acceleration region 236 during processes 150 generally is roughly equivalent to the maximum thickness of copper portion 244 that needs to be removed from field region 212. For this reason, plating of copper is continued in processes 140 generally until the difference in thickness between thicker copper in acceleration region 236 and less-thick copper in field region 212 approximates the desired final thickness of wiring line 250. The height of accelerated copper portion 242 in acceleration region 236 depicted in FIG. 9 is higher relative to base layer 204 than the height of field copper portion 244 relative to base layer 204. Nevertheless, since the difference in thickness between thicker copper portion 242 in acceleration region 236 and less-thick copper portion 244 in field region 212 is critical, it is possible to stop plating even before the height of copper portion 242 in acceleration region 236 exceeds the height of copper portion 244 relative to base layer 204, depending on the thickness of resist layer 206.

Figure 12:
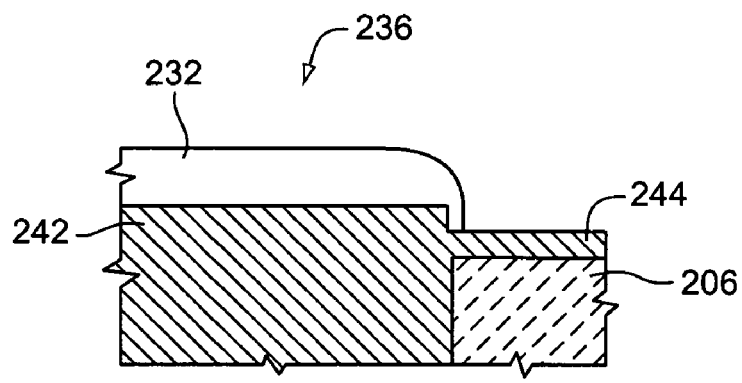
FIG. 12 depicts schematically an intermediate phase of plating processes in which the profile of copper in the acceleration region has just started to protrude above copper in the field region, and also depicts schematically the relative distribution of accelerator on the plated metal surface.
Figure 13:
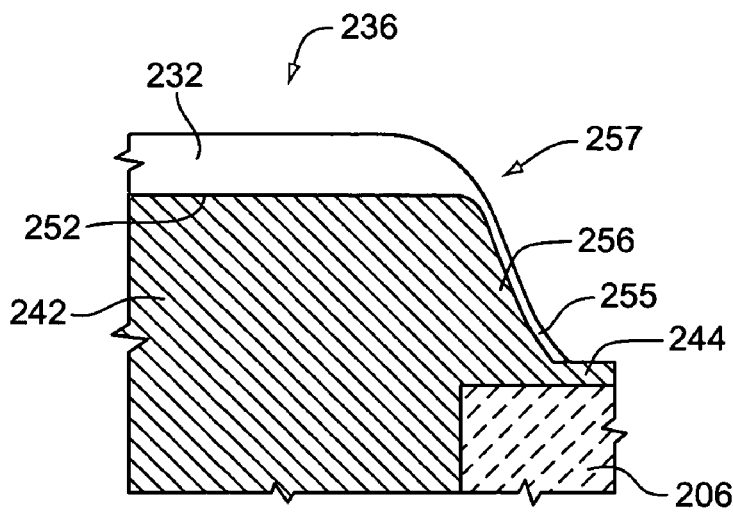
FIG. 13 depicts the workpiece of FIG. 12 in a later phase of plating processes in which the copper portion in the acceleration region has grown vertically at a much faster rate than copper in the field region because of the presence of accelerator on the top surface of copper in the acceleration region.

A feature of a method in accordance with the invention is that it forms a metal wire or other metal feature that does not encroach sideways, as would be the case with a through-resist plating technique. Experience has shown that the lateral mobility of accelerator in accordance with the invention is limited. FIG. 12 depicts an intermediate phase of plating processes 140 in which the profile of copper 242 at acceleration region 236 has just started to protrude above copper 244 in field region 212. The relative distribution of accelerator 232 on the metal surface is also depicted. FIG. 13 depicts a later phase of plating processes 140 in which accelerated copper portion 242 has grown vertically at a much faster rate than the field copper 244 because of the presence of accelerator 232 on the top surface 252 of copper portion 242 in acceleration region 236. Comparison of FIG. 13 with FIG. 12 shows that the relative amount of sidewall accelerator 255 on sidewall 256 of copper portion 242 decreases in the upward vertical direction as sidewall 256 grows vertically. It is believed that because the amount of acceleration is dependent on the surface concentration of accelerator, the degree of accelerated growth in the horizontal sidewards direction due to the presence of sidewall accelerator 255 decreases with the height of copper portion 242. Accelerated growth continues, however, at the top surface 252 of copper portion 242, especially in central areas away from edges 257. Because of loss of accelerator to the sidewalls, the enhancement of growth at edges 257 gradually decreases, and growth of copper portion 242 tends to taper inwards, instead of continuing to encroach sideways as in conventional conformal deposition. This geometric deceleration is inverse to the geometric acceleration that occurs in bottom-up fill processes in small, high-aspect-ratio features.

Typically, methods in accordance with the invention comprise global activation of the workpiece surface with an accelerator by one or more of a variety of means including, but not limited to: dipping the surface in a solution containing accelerator molecules; spraying the surface with an solution containing dissolved accelerator molecules; drying a surface of a liquid containing dissolved accelerator molecules or precursors of accelerator molecules; depositing a film from a vapor containing the accelerator molecules; electrochemically transforming precursors of accelerating molecules to form a chemically active accelerator, and electrolessly forming an accelerator. "Global activation" means that a substantial portion of the surface, typically the entire surface, including both field (exposed) and recessed regions of the surface, are activated by the accelerator.

Examples of suitable accelerator molecules include mercapto-group-containing molecules, such as 2-mercaptoethane sulfonic acid (MESA), 3-mercapto-1-propane sulfonic acid (MPSA), mercaptopyruvate, 3-mercapto-2-butanol, and 1-thioglycerol. These are typically used in aqueous solutions having a concentration in a range of about 1 ppm to 1000 ppm, generally at a pH-value less than about 5. These and similar accelerators have been found to adsorb strongly to a workpiece surface (e.g., copper metal seed layer) upon simple contact by spraying or immersion, but not to interfere substantially with the kinetics of an overall electrochemical charge transfer process, particularly in baths containing halides. It is likely that a large number of other accelerator molecules, undisclosed here or yet undiscovered, exist. Preferred accelerators in accordance with this invention can be adsorbed (or otherwise attached) onto a workpiece surface or region; are able to be removed selectively from exposed regions (e.g., using a technique such as buffing with a pad); are able to increase substantially the metal deposition rate over a rate observed without the accelerator; and are not significantly incorporated into the deposited metal during the deposition process (i.e., remain accelerating throughout the process).

EXAMPLE 1

Figure 14:
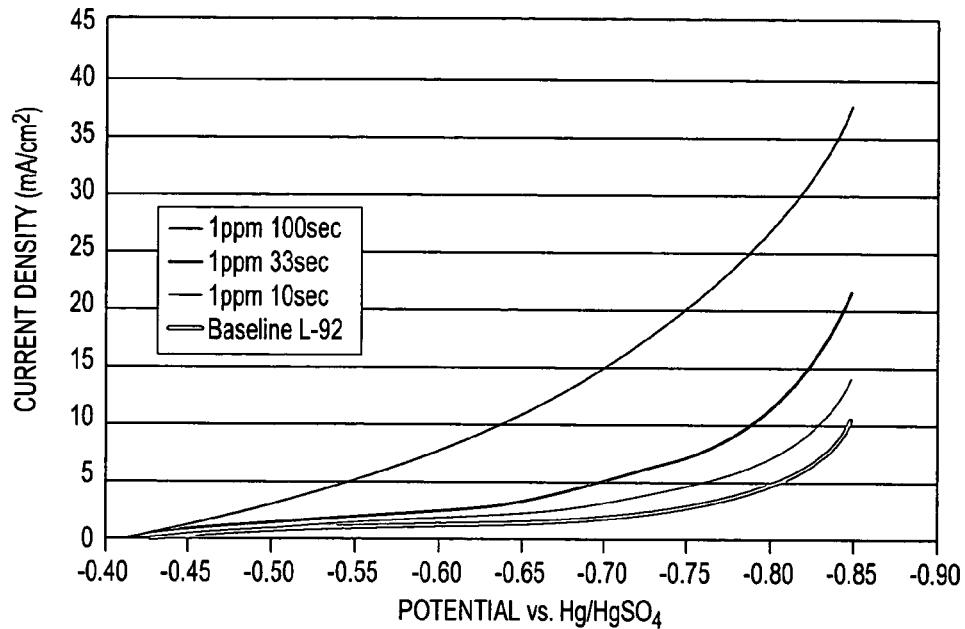
FIG. 14 depicts a voltammetric graph for substrates in an electrolyte whose surfaces were previously exposed to different dosage times in a 1 ppm solution of the accelerator MPSA.

It has been found that simply exposing the surface of a workpiece to certain accelerators like 2-mercaptoethane sulfonic acid (MESA) or 3-mercapto-1-propane sulfonic acid (MPSA) activates the surface. FIG. 14 shows a voltammetric plot (current density versus potential for the treated electrode) for substrates exposed to the accelerator MPSA for different exposure times. A copper rod rotating at 800 rpm was dipped in a solution containing the accelerator MPSA in deionized (DI) water for various exposure times and concentrations, then triple rinsed with DI water and plated in a solution of copper sulfate (40 g/l $Cu^{+2}$), sulfuric acid (30 g/L), chloride ion (50 ppm) and the suppressor Pluronic L-92 (a copolymer of polypropylene oxide and polyethylene oxide, 0.1 g/L)). Between each voltage scan, the surface was electropolished in phosphoric acid and rinsed in water to achieve a reproducible, highly microscopically smooth surface and remove any previously adsorbed accelerator. A clean surface with no prior exposure to the accelerator exhibited very little current over a very wide range of potentials (Baseline L-92 in FIG. 14). With increasing "dosage" of accelerator, (i.e., product of the time of exposure and concentration of the activating solution), the surface became increasingly "depolarized" and exhibited larger "active" currents at any given potential, as shown by the data curves plotted in FIG. 14. At sufficiently high doses, no further increase in plating rate was observed. In the accelerator-treated examples, the surface was not significantly polarized, showing that the accelerator was absorbed (or adsorbed) without the application of a current. Accordingly, MPSA accelerator can be applied by a simple spray or immersion process, activating the surface everywhere. The accelerator 2-mercaptoethyane sulfonic acid (MESA) and others have been shown to absorb in the same way without the need to apply a current. Because the activating accelerators strongly adhere to the surface, a plating bath need not contain accelerator in certain embodiments of this invention. As known in the art, while many of the accelerator compounds are referred to in the acidic form, it is understood the various salts of the acidic compounds also work well.

An accelerator solution is typically an aqueous solution and may contain small amounts of acids (0.2 to 2 weight %), found to stabilize the chemical in water. Alternatively, an accelerator solution comprises a non-aqueous solvent (e.g., alcohols or ketones) that dissolves the accelerator molecules at the desired concentration. Factors such as material and waste handling costs, activity of the accelerator in the solvent for adsorption to the substrate, and ease of drying influence the selection of the particular solvent. Other components of an accelerator solution may include dissolved copper ions, suppressing plating additives, levelers, or other formulation materials that do not significantly interfere with the accelerator adsorption process. In preferred embodiments, an accelerator solution contains a concentration of accelerator molecules that leads to the saturation of the surface with adsorbed accelerator molecules. At such high concentrations, the amount of adsorbed additive does not depend on the exact solution concentration or the surface exposure time to the solution. Under these conditions, the accelerator solution can be reused several times, treating many substrates, without concern for careful concentration control and process times.

Suitable accelerators do not substantially suppress or retard the metal deposition charge transfer process in an electroplating process, and are effective in inhibiting access of a suppressor compound to the accelerator-containing surface (thereby allowing significantly higher contrasting plating compared to the non-accelerated surface condition in the presence of the suppressor).

It has also been found that in baths containing dimercaptopropane sulfonic acid (DMPSA) or dimercaptoethane sulfonic acid (DMESA), for example, surface depolarization ("activation") of the accelerator can occur only after a high current density and/or potential is applied to the workpiece surface. A sufficiently high current/potential applied for a sufficient time substantially reduces polarization. This effect remains even after returning to lower current/potentials. While not being bound by any particular theory, this threshold current/potential appears to result in one or more reactions that build up a strongly adsorbed activating product. More specifically, it appears that DMPSA is electrochemically reduced to MPSA (and DMESA to MESA), which is the effective accelerating molecule.

Treating the workpiece to provide the plating accelerator typically involves contacting the workpiece with a solution containing the accelerating molecules or their precursors. Contact can be by immersion, spraying, spin coating, vapor deposition, in situ synthesis on the surface, etc. The plating accelerator may attach to the surface by various mechanisms, including chemical adsorption, physical adhesion, and the like. Therefore, the terms "accelerator" and "accelerator film" used in this specification and in the claims below are used broadly to include accelerator molecules or accelerator species contained in or attached to a workpiece surface. After application of the accelerator to the workpiece surface, the workpiece surface may be rinsed to remove entrained accelerator solution (e.g., to avoid transfer of the accelerator additive to subsequent processing modules and their solutions, thereby avoiding contaminating the overall process). Depending on the type of accelerator used and the operational sequence used following its application, the workpiece may be dried prior to selective removal of the accelerator from field regions, or kept wet. Because of the relative chemical stability and the strong adhesion to workpiece surfaces of accelerators in accordance with the invention, it is generally unnecessary to process (e.g., electroplate) the workpiece right after activation with accelerator or after selective removal of accelerator. The work-piece may be stored until it is convenient to perform further processing.

Figure 15:
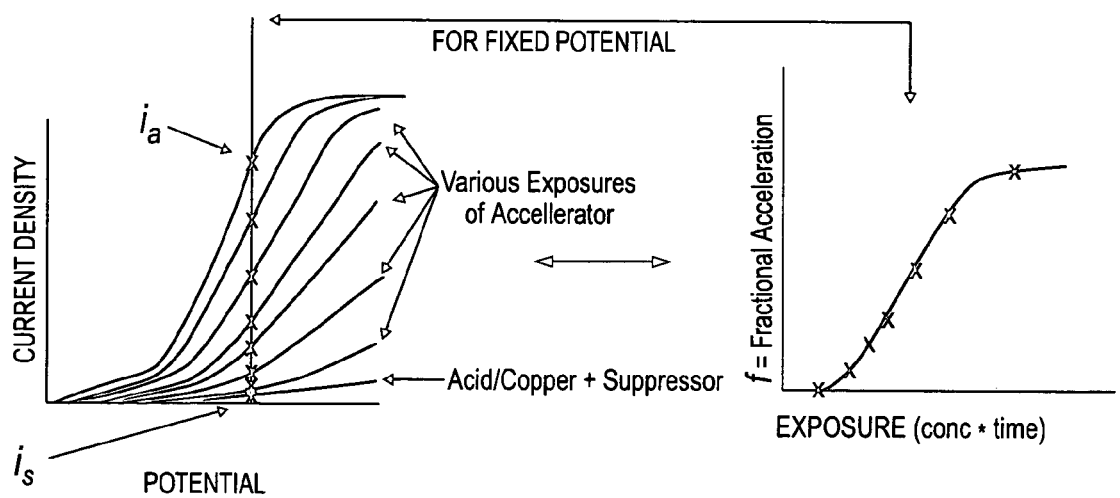
FIG. 15 depicts a graph showing the relationship between exposure to activating additive (in terms of concentration and time of exposure) and fractional acceleration, a dimensionless parameter indicating the degree of plating acceleration in comparison to complete suppression and complete acceleration.

From curves such as those shown in FIG. 14, one can construct a graph showing the relationship of fractional acceleration vs. accelerant exposure, FIG. 15, by plotting the dimensionless fractional acceleration f, $$f = \frac{i - i_s}{i_a - i_s}$$

as a function of exposure to accelerator. The variable i is the current at a given potential, and the terms $i_a$ and $i_s$ are the currents at the same potential after full-activation and no-activation exposure conditions, respectively. The maximum contrast in plating rate between non-activated (also referred to as suppressed) surface and a full-activation surface can also be calculated as a function of potential as $$C_{max} = \frac{i_a}{i_s}$$

Assuming complete removal of accelerator from exposed regions during the removal step of the process, this is the maximum achievable ratio of plating rates between acceleration regions (e.g., recessed features) and non-accelerated regions (e.g., field regions) and can be used to determine optimal operating points.

Processes causing selective concentration of accelerator species in a recessed region relative to the presence of accelerator in an adjacent field region are important in a method in accordance with the invention for generating a patterned copper wire or other metal wiring. As described above, these processes generally comprise selective removal of the accelerator chemicals/film from exposed "field" areas, while not removing the accelerator from a recessed region. Techniques in accordance with the invention for selective removal of accelerator film chemicals from a workpiece have been described in co-pending U.S. patent application Ser. No. 10/739,822.

While embodiments in accordance with the invention are not dependent on any particular removal mechanism, selective removal of the accelerating film typically involves any one or more of the following: incorporating or reacting accelerator material into/with the rubbing pad; buffing the workpiece surface while flowing a solvent with solutes over the surface, to facilitate dissolution of the accelerator into a flowing solvent; forming aggregates or particles from an accelerator film and mechanically removing them from the surface (e.g., rinsing them away); forcing accelerator film material to become incorporated into the underlying seed metal (thereby lowering the surface concentration of accelerator); mechanically removing the accelerator with an abrasive polishing slurry and pad, and striking the surface with grazing-angle high-energy particles, using the momentum of the particles to eject or sputter-off the accelerator. In some embodiments, it is desirable to perform a separate rinse operation after a rubbing pad or other element has been separated from the workpiece surface.

Mechanically-facilitated removal of the surface-adsorbed accelerator involves frictional work accomplished by the rubbing action between a friction creating pad and the workpiece. Processes that are effective in removing accelerator, but not underlying metal seed layer (i.e., that have good accelerator to metal removal selectivity), enable over-rubbing, which ensures complete removal of accelerator from a field region. The pad is moved relative to the work-piece while an applied (global or superficial) pressure of from 0.05 to 2 pounds per square inch is applied. The relative speed of motion between the surfaces is typically from 0.02 meter/sec to 2 meter/sec. The relative motion between the pad and the work-piece can be achieved using a number of different methods commonly known in the art of lens manufacturing and chemical mechanical polishing (CMP). These include orbital motion, linear motion, counter rotational, off axis counter rotational, and the like.

A rubbing pad typically comprises an organic polymer material, has relatively high compressive strength, and is superficially substantially non-compliant. This is important so that the pad does not remove adsorbed accelerator from the surface inside the low-aspect-ratio feature of the recessed region. In many cases, the pad is formed using a layered structure, wherein a relatively thin film of a more-compliant, micro-rough and porous polymer (suitable for creating high local pressures and wear) is mated with a rigid backing (ensuring that the pad will not dish into a feature bottom; e.g., into recessed region 210). The micro-roughness is typically provided by an air-blown film or the like, and can be periodically conditioned using a diamond reconditioning tool, as known in the art. Typical materials of construction of the working surface include polyurethane and polyfurfal alcohol (PFA). A suitable commercially-available pad is the IC 1000 pad, supplied by Rodel Corporation of Phoenix, Ariz.

Without certainty as to a particular theoretical mechanism by which an accelerator film is removed from a workpiece surface, it is believed that an important part of removal involves the combination of chemical and mechanical energy used to break an accelerator-metal bond (e.g., in a mercapto-based accelerator, the sulfur-metal bond). Factors that influence the rate and degree of selective removal include parameters such as shear rate, pressure, roughness, lubricating liquid solvent and solutes, pad chemical composition, pad affinity for (reactivity with) the accelerator, and initial concentration of accelerator on the pad surfaces and in the pad bulk.

EXAMPLE 2

Figure 16:
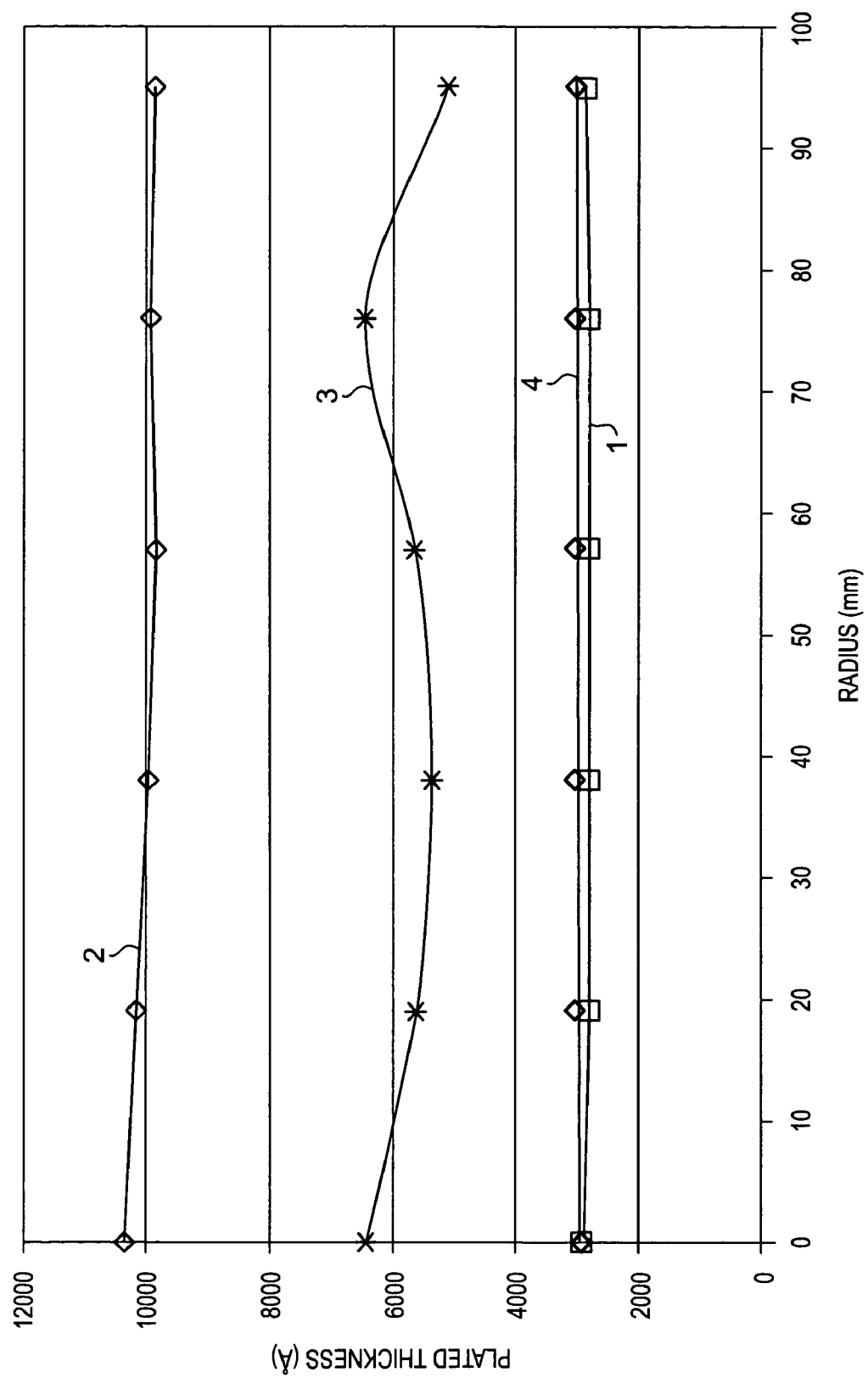
FIG. 16 depicts a graph showing the thickness profile of exemplary substrate wafers after various activation, rubbing, and plating processes.

A technique was developed that is useful in measuring the effectiveness and rate of accelerator film (adsorbate) removal. The technique involves comparing the electroplating response of accelerator-activated wafers, non-activated wafers, and wafers activated and rubbed (under various process conditions) in a plating bath. Non-featured 200 mm wafers containing a plasma vapor deposited (PVD) metal seed layer (125 nm Cu over 30 nm Ta) were used. A non-activated wafer was plated in a Novellus Systems Sabre™ plating tool, using a plating solution containing 35 g/L copper ion, 40 g/L sulfuric acid, 50 ppm chloride ion, and 0.2 g/L Pluronic L-62, and containing no accelerators or levelers. The wafer was plated for 300 seconds at constant potential (i.e., at 0.70 V relative to a $Hg/HgSO_4$ reference electrode). The reference electrode was ionically connected to the cell using the so-called Luggin-Haber capillary (see A. Bard and L. Faulkner, *Electrochemical Methods: Fundamentals and Applications*, John Wiley and Sons, Inc, New York, 1980, p. 24.). The current charge passed, and a map of the changes in sheet resistance (before and after plating, converted to net plated film thickness distribution) was recorded. Difference contour data were converted to radial averages, and plated thickness was plotted as a function of radius. Curve 1 in FIG. 16 shows a baseline profile of an untreated wafer plated in a suppressed bath. This was a suppressed-wafer baseline condition. The process was repeated again, except copper was plated onto an accelerator-activated wafer, yielding an activated-wafer baseline condition (curve 2, FIG. 16). The accelerator-activation process involved pre-wetting the wafer with a stream of DI water (300 rpm, 500 cc/min, 10 seconds), spraying the wafer with a solution of 1 g/L MPSA in water (300 rpm, 100 cc/min flow, for 10 seconds), followed by rinsing with DI water (300 rpm, 20 seconds), and finally spin drying (1500 rpm, 25 seconds). The wafer was then plated in the same manner as above, and the same data set was collected. This is the activated wafer baseline. Depending on the potential and other conditions chosen, the thickness of plated copper on the activated wafer was 2 to 15 times thicker than on the non-activated wafer. Increasing the concentration or exposure time of accelerator solution did not significantly change the wear-removal or electroplating behavior of the surface, indicating that the surface was saturated with MPSA. Finally, accelerator-activated wafers were placed in a Novellus Systems orbital polishing tool where buffing conditions such as average pressure, pressure distribution, orbital rotation rate, pad material, rubbing solution (lubricant) and time were varied. This created activated wafer surfaces and rubbed wafer surfaces. After rubbing, wafers were plated in the same plating solution under the same plating conditions as above. Curves 3 and 4 of FIG. 16 show the effect of buffing times (15 and 30 seconds, respectively) on the plating response using an IC1000 buffing pad and a buffing fluid/lubricant (of the same composition as the plating solution described above) at a flow rate of 200 ml/min.

For a given set of operating conditions, the rate of removal of attached accelerator film generally increases with shear rate (rotation rate) and applied pressure (i.e., removal rate is proportional to rate of work). However, too much applied pressure could lead to damage of the underlying device structures, particularly with current industrial trends to use mechanically weak, porous low-K dielectric materials in electronic devices. Therefore, it is desirable to use methods and materials to minimize the applied stress needed to remove the adsorbed accelerator, without substantially removing the underlying base metal. Use of excess force, non-optimal pads, poor lubricants and lubricant flow distribution may lead to unwanted excess and/or non-uniform removal of base seed metal or other underlying base material.

Use of the procedure described above to compare the effectiveness of accelerator removal showed that certain aqueous lubricant constituents affect accelerator removal. In general, an acidic solution should be slightly oxidizing (e.g, contain approximately a 2 ppm to 500 ppm concentration of an oxidizer such as oxygen, hydrogen peroxide, permanganate, or ozone) and contain a soluble or complexing metal salt (e.g., sulfate or citrate, respectively) at a pH at which the metal is at least marginally soluble (e.g., ~0.1 g/L copper ion). It is believed that the presence of the oxidizer weakens the accelerator-metal bond by shifting the metal potential to a more positive (anodic) value and may result in slight etching, allowing high regions to be removed and exposing low regions so that accelerator can be removed from them more effectively. In the case of MPSA, the surface probably becomes more positively charged under these oxidizing conditions, potentially weakening the mercapto-sulfur to copper bond. Of course, excess amounts of oxidizer would cause the underlying metal to corrode. Similarly, a strong specifically-adsorbing chloride ion is found to aid in the chemical/mechanical removal of the accelerator. A chloride-ion concentration of from 25 ppm to 1000 ppm is generally suitable. Finally, a chloride-activated suppressor (e.g., PEO/PPO type polymers, 0.05 to 0.5 g/L) is useful in obtaining the benefit of weakening the mercapto-metal bound, without the undesirable high metal-corrosion rate typically catalyzed by the presence of chloride ions. The suppressor also acts as a wetting agent/surfactant and a lubricant. As a specific example, an oxygen-saturated solution containing 40 g/L sulfuric acid, 30 g/L copper sulfate, 0.4 g/L Pluronic L-62, and 250 ppm chloride ion was found to be highly effective in selectively removing accelerator from activated wafers. Alternatively, more neutral lubricating solutions (e.g., pH-adjusted with tetramethylammonium hydroxide), containing a copper complexing agent such as citric acid or glycine, were also found effective in selective accelerator removal. It is believed the metal surface oxidizes (e.g., to cuprous oxide), which weakens the accelerator-metal bond and makes the surface layer more easily removable (along with the attached accelerator) by the mechanical action of the pad. Typically, concentrations of 0.4 to 4 g/L glycine are used; for example, higher concentrations of glycine (2 to 4 g/L) with low levels of oxidizer (e.g., saturated oxygen, with less than 1 g/L hydrogen peroxide), or less glycine (0 to 2 g/L) and a high concentration of hydrogen peroxide (10 to 100 g/L). As a specific example, a solution containing 0.5 g/L glycine and 15 g/L peroxide, flowing at a rate of 150 ml/min through a IC1000 pad with orbital radius of 16 mm and a rotation rate of 600 rpm, was highly effective in rapidly removing accelerator without significant unwanted removal of the metal seed layer.

Other mechanisms for selectively removing additive from the exposed surfaces of the field region include grazing-angle ion bombardment and grazing-angle laser ablation.

An electroplating solution generally contains a reducible ion (e.g., copper) to allow electroplating. A plating solution in accordance with the invention may be similar to conventional plating solutions, but preferably contains relatively little or no activating additive or brightener, making it unnecessary to remove that additive from the surface. Typically, a plating solution in accordance with the invention contains no more than about 10 ppm by weight of a chemically-activated accelerator (or a form of accelarator that is readily activated during electroplating). An electrolyte solution used in accordance with the invention typically is similar to those used in IC damascene copper electroplating (electrofill baths). For example, a typical copper electroplating solution comprises a copper sulfate/sulfuric acid solution, a PEO/PPO-type suppressor (see below), and chloride ions. Other bath chemistries may be employed for other types of electroplating. Because the plating bath contains relatively low concentrations of reactive accelerator, it will typically have a much longer useful lifetime than comparable conventional solutions that have relatively large quantities of such accelerator, reducing the need for bath additive concentration metrology.

A plating bath generally contains suppressor molecules with molecular weight from 500-10,000 (e.g., various linear and block polymers and copolymers of polyethylene and polypropylene oxides in the specified weight range). These "polarize" the electrochemical interface (i.e., increase the applied voltage necessary to obtain the same current with respect to a no-suppresor case). A small concentration of halide ions (e.g., chloride and/or bromide) is generally employed to facilitate the polarizing behavior of the suppressing molecules. While not wanting to be held to any specific model or theory, the halide ions are thought to form a physical bond or complex with the suppressor. Because the halide ion generally concentrates at a surface because of its specific adsorption characteristic, the polymer also concentrates there. This absorption of the suppressor onto the metal surface interferes with various physical and chemical kinetic processes related to the overall electrochemical deposition process, causing the surface to become significantly polarized.

The surface concentration of accelerator molecules should be greater in acceleration region 236 (FIGS. 7, 8) than in field region 212 during the plating operation. In a method 100 as described above, this is accomplished by applying an accelerator solution globally to the workpiece surface in processes 130 of FIG. 1, selectively removing accelerator in processes 134, and then using a plating solution in processes 140 that contains little or no accelerator. In some embodiments in accordance with the invention, a single solution containing an electrochemically active precursor of accelerator compound is used for both global activation and plating. The single solution contains no accelerating compounds, but it does contain precursors of accelerating compounds that are activated only at a potential/current not encountered during electroplating. An accelerator film is formed from the solution using a first, high potential/current in processes such as processes 130; portions of the accelerator film are removed, as in processes 134; then, in processes such as processes 140, metal is electroplated from the solution using a second, lower-magnitude potential/current under which the accelerator precursor does not react to produce additional accelerator. Such embodiments have the disadvantage that significant amounts of metal may be plated in the field area simultaneously with the formation of the globally activated film, hence leading to the need to remove more field metal in subsequent processing.

PWB wiring, other metal structures and features in electronic devices, and methods and precursors for forming them in accordance with the invention are useful in a wide variety of circumstances and applications. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. For example, certain embodiments in accordance with the invention comprise: applying a metal seed layer to a base layer; masking the seed layer to define a region for a metal structure; slightly plating metal in unmasked regions to create a recessed region corresponding to the masked region and a slightly raised region; globally applying accelerator to the substrate; selectively removing accelerator by buffing the raised metal regions to create an acceleration region in the recessed region; then plating metal on the substrate at an accelerated rate in the acceleration region. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the methods and structures described in the claims below and by their equivalents.

The invention claimed is:

1. A method of forming a copper wiring line, comprising:
    providing a workpiece having a resist layer and a metal seed layer, said resist layer having a recessed region and an adjacent field region, said metal seed layer covering at least a portion of said workpiece, including in said recessed region and on said field region;
    then causing a plating accelerator to become attached to said metal seed layer selectively in said recessed region, with relatively little or no accelerator attached to said metal seed layer in said field region, thereby forming an acceleration region in said recessed region;
    then plating copper on said workpiece, wherein said accelerator selectively attached in said acceleration region increases a rate of copper plating in said acceleration region relative to a rate of copper plating in said field region;
    continuing plating copper until a height of plated copper in said acceleration region is higher than a field copper height in said field region; and
    then after said plating copper, removing metal substantially completely from said field region by removing metal substantially isotropically from said acceleration region and said field region.

2. A method as in claim 1 wherein said removing metal from said field region does not substantially include chemical mechanical polishing (CMP), subtractive etching, or masking said workpiece.

3. A method as in claim 1 wherein said providing said workpiece comprises:
    applying a resist layer to a base layer of said workpiece; and
    then patterning said resist layer to form said recessed region and said field region.

4. A method as in claim 1, further comprising:
    removing said resist layer from said field region after said removing copper from said field region.

5. A method as in claim 1, wherein causing an accelerator to become attached to said metal seed layer selectively in said recessed region comprises:

globally applying an accelerator film on said metal seed layer; and then selectively removing at least a portion of said accelerator film from said metal seed layer in said field region.

6. A method as in claim 1 wherein said providing said workpiece comprises:

providing a workpiece having a metal-containing barrier layer on said workpiece, including in said recessed region and in said field region, under said metal seed layer.

7. A method as in claim 1 wherein said continuing plating copper comprises:

plating copper until the difference between a height of plated copper in said acceleration region and a field copper height in said field region approximates a desired final thickness of copper wiring line.

8. A method as in claim 7 wherein said continuing plating copper comprises:

plating copper until the difference between a height of plated copper in said acceleration region is at least 3 μm higher than a field metal height in said field region.

9. A method as in claim 1 wherein said removing metal substantially isotropically comprises:

isotropic etching of metal from said acceleration region and said field region.

10. A method as in claim 9 wherein said isotropic etching of metal comprises:

isotropic wet etching of metal from said acceleration region and said field region.

11. A method as in claim 1 wherein said providing said workpiece comprises:

providing a workpiece having a recessed region and an adjacent field region;

then depositing a metal seed layer on said workpiece, including in said recessed region and on said field region.

12. A method as in claim 11, further comprising depositing a metal-containing barrier layer on said workpiece, including in said recessed region and in said field region, before said depositing a metal seed layer.

13. A method of forming a metal structure in an electronic device, comprising:

providing a workpiece having a resist layer, said resist layer having a recessed region and an adjacent field region;

then causing an accelerator to become attached to said workpiece selectively in said recessed region, thereby forming an acceleration region in said recessed region, with relatively little or no accelerator attached to said workpiece surface in said field region;

then depositing metal on said workpiece, wherein said accelerator attached in said acceleration region increases a rate of metal deposition in said acceleration region relative to a rate of metal deposition in said field region;

continuing depositing metal until a height of deposited metal in said accelerated recessed region is higher than a metal height in said field region; and then after said depositing metal, removing metal substantially completely from said field region by removing metal substantially isotropically from said acceleration region and said field region.

14. A method as in claim 13 wherein said continuing depositing metal comprises:

depositing metal until the difference between a height of metal in said acceleration region and a field metal height in said field region approximates a desired final thickness of said metal structure.

15. A method as in claim 13, further comprising:

continuing depositing metal until a height of metal in said acceleration region is at least 3 μm higher than a field metal height in said field region.

16. A method as in claim 13 wherein said removing metal substantially isotropically comprises:

isotropic etching of metal from said acceleration region and said field region.

17. A method as in claim 16 wherein said isotropic etching of metal comprises:

isotropic wet etching of metal from said acceleration region and said field region.

18. A method as in claim 13 wherein said removing metal substantially completely from said field region does not substantially include chemical mechanical polishing (CMP), subtractive etching, or masking the workpiece.

19. A method as in claim 13 wherein said workpiece comprises a base layer, and wherein said providing said workpiece comprises:

applying a resist layer to said base layer; and then patterning said resist layer to form said recessed region and said field region.

20. A method as in claim 13 further comprising:

removing said resist layer from said field region after said removing metal from said field region.

21. A method as in claim 13, further comprising depositing a metal seed layer on said workpiece, including in said recessed region and in said field region, before said causing an accelerator to become attached.

22. A method as in claim 21 wherein said depositing a metal seed layer on said barrier layer comprise:

conducting electroless deposition of said metal seed layer.

23. A method as in claim 21, further comprising:

depositing a metal-containing barrier layer on said workpiece, including in said recessed region and in said field region, before said depositing said metal seed layer.

24. A method as in claim 13 wherein said providing said workpiece comprises:

providing a workpiece having a metal seed layer on at least a portion of said resist layer, including in said recessed region and in said field region.

25. A method as in claim 24 wherein said providing said workpiece comprises:

providing a workpiece having a metal-containing barrier layer on said workpiece, including in said recessed region and in said field region.

26. A method as in claim 13 wherein said depositing metal comprises depositing copper.

27. A method as in claim 13, wherein causing an accelerator to become attached to said workpiece surface selectively in said recessed region comprises:

globally applying an accelerator film on said workpiece surface; and then selectively removing at least a portion of said accelerator film from said workpiece surface in said field region.

28. A method as in claim 27 wherein said applying an accelerator film comprises:

applying a liquid accelerator solution.

29. A method as in claim 28 further comprising:

after said applying said liquid accelerator solution, removing liquid accelerator solution from said workpiece without substantially removing said accelerator film from said workpiece.

30. A method as in claim 29 wherein said removing liquid accelerator solution from said workpiece comprises:
rinsing said workpiece with liquid solvent, said liquid solvent having a lower concentration of accelerator than a concentration of accelerator in said liquid accelerator solution.

31. A method as in claim 29 wherein said removing liquid accelerator solution from said workpiece comprises:
drying said workpiece.

32. A method as in claim 27 wherein said applying said accelerator film comprises:
applying accelerator to a metallic layer on said workpiece.

33. A method as in claim 27 wherein said applying said accelerator film comprises:
applying accelerator molecules selected from the group consisting of 2-mercaptoethane sulfonic acid (MESA), 3-mercapto-1-propane sulfonic acid (MPSA), mercaptopyruvate, 3-mercapto-2-butanol, 1-thioglycerol, dimercaptopropane sulfonic acid (DMPSA), dimercaptoethane sulfonic acid (DMESA), and salts thereof.

34. A method as in claim 13 wherein:
after said removing metal substantially completely from said field region, remaining deposited metal protrudes above said resist layer.

35. A method of forming a metal structure in an electronic device, comprising:
providing a workpiece having a resist layer, said resist layer having a recessed region and an adjacent field region;
then causing an accelerator to become attached to said workpiece surface selectively in said recessed region, thereby forming an acceleration region in said recessed region, with relatively little or no accelerator attached to said workpiece surface in said field region;
then depositing metal on said workpiece, wherein said accelerator attached in said acceleration region increases a rate of metal deposition in said acceleration region relative to a rate of metal deposition in said field region;
continuing depositing metal until an accelerated thickness of deposited metal in said acceleration region is thicker than a field thickness of metal in said field region;
then after said depositing metal, removing metal substantially completely from said field region; and
then removing said resist layer from said field region after said removing metal from said field region.

36. A method as in claim 35 wherein said continuing depositing metal comprises:
depositing metal until the difference between an accelerated thickness of metal in said acceleration region and a field thickness of metal in said field region approximates a desired final thickness of said metal structure.

37. A method as in claim 35, further comprising:
continuing depositing metal until an accelerated thickness of metal in said acceleration region is at least 3 μm thicker than a field thickness of metal in said field region.

38. A method as in claim 35 wherein said removing metal substantially completely from said field region comprises:
removing metal substantially isotropically from said acceleration region and said field region.

39. A method as in claim 38 wherein said removing metal substantially isotropically comprises:
isotropic etching of metal from said acceleration region and said field region.

40. A method as in claim 39 wherein said isotropic etching of metal comprises:
isotropic wet etching of metal from said acceleration region and said field region.

41. A method as in claim 38 wherein said removing metal substantially completely from said field region does not substantially include chemical mechanical polishing (CMP), subtractive etching, or masking the workpiece.

42. A method as in claim 35, further comprising:
depositing a metal seed layer on said workpiece, including in said recessed region and in said field region, before said causing an accelerator to become attached.

43. A method as in claim 35 wherein said depositing a metal seed layer comprises:
conducting electroless deposition of said metal seed layer.

44. A method as in claim 35, further comprising:
depositing a metal-containing barrier layer on said workpiece, including in said recessed region and in said field region, before said depositing a metal seed layer.

45. A method as in claim 35 wherein said depositing metal comprises depositing copper.

46. A method as in claim 35, wherein causing an accelerator to become attached to said workpiece surface selectively in said recessed region comprises:
globally applying an accelerator film on said workpiece surface; and
then selectively removing at least a portion of said accelerator film from said workpiece surface in said field region.

* * * * *